(12) United States Patent
Chang et al.

(10) Patent No.: US 7,772,679 B2
(45) Date of Patent: Aug. 10, 2010

(54) MAGNETIC SHIELDING PACKAGE STRUCTURE OF A MAGNETIC MEMORY DEVICE

(75) Inventors: Shu-Ming Chang, Hsinchu (TW); Ying-Ching Shih, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 226 days.

(21) Appl. No.: 12/213,660

(22) Filed: Jun. 23, 2008

(65) Prior Publication Data

US 2009/0045488 A1   Feb. 19, 2009

(30) Foreign Application Priority Data

Aug. 13, 2007   (TW) ............... 96129808 A

(51) Int. Cl.
  *H01L 21/00*   (2006.01)
(52) U.S. Cl. .............. 257/659; 257/435; 257/660; 257/E23.114; 257/E23.129; 257/E23.181; 257/E23.185; 257/E27.005; 257/E43.004; 257/E43.006
(58) Field of Classification Search .......... 257/433, 257/659, 660, E23.114, 129, 181, 185, E27.004, 257/E43.004, 6
  See application file for complete search history.

(56) References Cited

U.S. PATENT DOCUMENTS

| | | | |
|---|---|---|---|
| 4,953,002 A | 8/1990 | Nelson et al. | |
| 5,939,772 A | 8/1999 | Hurst et al. | |
| 6,317,301 B2 * | 11/2001 | Narumi et al. | 360/327.32 |
| 6,559,521 B2 | 5/2003 | Tuttle | |
| 6,664,613 B2 | 12/2003 | Tuttle | |
| 6,717,241 B1 | 4/2004 | Tuttle | |
| 6,756,128 B2 * | 6/2004 | Carey et al. | 428/811.1 |
| 6,853,055 B1 * | 2/2005 | Kuang | 257/659 |
| 6,880,242 B2 * | 4/2005 | Van Antwerp et al. | 29/832 |
| 6,929,957 B2 * | 8/2005 | Min et al. | 438/3 |
| 6,936,763 B2 * | 8/2005 | Rizzo et al. | 174/391 |
| 6,962,833 B2 | 11/2005 | Tuttle et al. | |
| 6,967,390 B2 | 11/2005 | Johnson | |
| 7,489,015 B2 * | 2/2009 | Stobbs | 257/433 |
| 2004/0119095 A1 | 6/2004 | Tuttle et al. | |
| 2004/0150091 A1 | 8/2004 | Stobbs | |
| 2004/0152261 A1 * | 8/2004 | Spencer et al. | 438/257 |
| 2005/0226030 A1 * | 10/2005 | Kato et al. | 365/154 |
| 2006/0019422 A1 | 1/2006 | Tuttle et al. | |
| 2006/0180880 A1 | 8/2006 | Wang et al. | |
| 2006/0237823 A1 * | 10/2006 | Spielberger et al. | 257/659 |
| 2006/0289970 A1 | 12/2006 | Gogl et al. | |
| 2010/0033871 A1 * | 2/2010 | Campos et al. | 360/110 |

\* cited by examiner

*Primary Examiner*—Michael S Lebentritt
(74) *Attorney, Agent, or Firm*—Birch, Stewart, Kolasch & Birch, LLP

(57) ABSTRACT

This invention provides a magnetic shielding package structure of a magnetic memory device, in which at least a magnetic memory device is embedded between a magnetic shielding substrate and a magnetic shielding layer. A plurality of through vias is formed in the magnetic shielding substrate or the magnetic shielding layer, and a plurality of conductive contacts passes through the through vias such that electrical connection between the magnetic memory device and the external is established.

33 Claims, 7 Drawing Sheets

MAGNETIC SHIELDING PACKAGE STRUCTURE OF A MAGNETIC MEMORY DEVICE

BACKGROUND OF THE INVENTION

1. Field of the Invention

The present invention relates to a magnetic shielding package structure of a magnetic memory device, and more particularly to a magnetic shielding package structure of a wafer-level magnetic memory device.

2. Description of the Related Art

The principles adopted in the application of magnetic memory device are similar to those in the hard disk, while the fabrication thereof is highly compatible with the semiconductor processing and the operating speed thereof is substantially comparable with that of the static random access memory (SRAM). Moreover, the magnetic memory device is basically constructed by a transistor and a magneto-resistor for memory, which is similar to the existing dynamic random access memory (DRAM), and hence the fabrication cost therefor is possibly parallel with that for the existing DRAMs. The magnetic memory device exhibits the advantages of existing memories or storage devices such as the high density hard disk (HDD), flash memories, SRAMs and DRAMs, and is thus regarded as a next-generation memory technique of great potential in replacing the existing ones. It is typically believed that since the magnetic memory device adopts the magnetic material as the core unit for memory, the operation thereof may be inversely affected and the data storage thereof may be inaccurate or even disappear when such device is suffering the disturbance caused by an external magnetic field. Accordingly, the package for the magnetic memory device shall be well designed and constructed so as to prevent the data storage thereof from being erroneous or disappeared due to the disturbance caused by the external magnetic field while in use.

It is found that U.S. Pat. No. 6,967,390 discloses a package structure for leadframe, which adopts a magnetic shielding carrier therein but possesses a relatively inferior ability in magnetic shielding. Moreover, U.S. Pat. No. 4,953,002 also discloses a package structure for leadframe in which the magnetic shield is provided respectively above and below the die within the molding layer. Nevertheless, such package structure lacks the capacity of magnetic shielding. With regard to the package structure for leadframe as disclosed in U.S. Pat. No. 5,939,772, a magnetic shield is respectively attached to the upper side as well as the lower side of package structure, by which the magnetic shielding is still difficulty achieved, however. A further kind of package structure for flip-chip is disclosed by respective U.S. Pat. Nos. 6,559,521, 6,664,613 and 6,717,241, in which the interposer and the printed circuit board thereof include respective protection layers for magnetic shielding. Nevertheless, it is believed only the backside of such package structure could exhibit the ability in magnetic shielding and the efficiency thereof is relatively low. Referring to the respective disclosures of U.S. Pat. No. 6,962,833 as well as U.S. Pub. Nos. 20040119095 and 20060019422, a package structure for leadframe is provided with the magnetic shield respectively attached to the upper and lower sides of the molding layer thereof. By such structure, however, it still fails to achieve the purpose of magnetic shielding. As to the package structure for flip-chip as disclosed in U.S. Pub. No. 20040150091, the magnetic shielding effect is not induced thereby even though such structure adopts a molding layer of magnetic shielding characteristic and an interposer containing magnetic shielding materials. In U.S. Pub. No. 20060180880, a package structure for flip-chip is provided. The package structure is constructed by a composite of two different magnetic shielding materials, but the magnetic shielding effect is only realized on the upper surface and both sides thereof, which is relatively low. With reference to U.S. Pub. No. 20060289970, it is disclosed that the whole circuit module is contained within a magnetic shielding metal house. In this case, however, the module itself possesses no ability in magnetic shielding.

Based on the above, it is desired to provide a further magnetic shielding package structure, which provides the magnetic shielding effect and thereby the magnetic memory device is protected.

SUMMARY OF THE INVENTION

The present invention provides a magnetic shielding package structure of a magnetic memory device, in which at least a magnetic memory device is embedded between a magnetic shielding substrate and a magnetic shielding layer thereof, so as to protect the magnetic memory device from being interfered by an external magnetic field.

The magnetic shielding package structure of a magnetic memory device according to the present invention includes a magnetic shielding substrate, at least one magnetic memory device, a magnetic shielding layer and a plurality of conductive contacts. The magnetic memory device is provided on the magnetic shielding substrate, and thereon the magnetic shielding layer having a plurality of through vias is laminated. By means of the through vias, the electrical connection between the magnetic memory device and the external is established.

According to the present invention, the magnetic memory device is embedded between the magnetic shielding substrate and the magnetic shielding layer, so that not only the magnetic memory device is protected from suffering the disturbance caused by an external magnetic field, but the area and height of the whole package structure of the magnetic memory device is reduced.

DETAILED DESCRIPTION OF THE PREFERRED EMBODIMENT

With reference to the following disclosures combined with the accompanying drawings, the magnetic shielding package structure of a magnetic memory device according to the present invention is illustrated and understood.

Figure 1A:
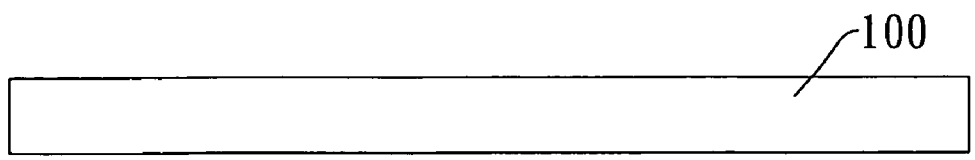
FIGS. 1A to 1G are schematic cross-sectional views corresponding to various stages of a method for forming a wafer-level package structure of a magnetic memory device according to a first embodiment of the present invention.
Figure 1B:
Figure 1C:
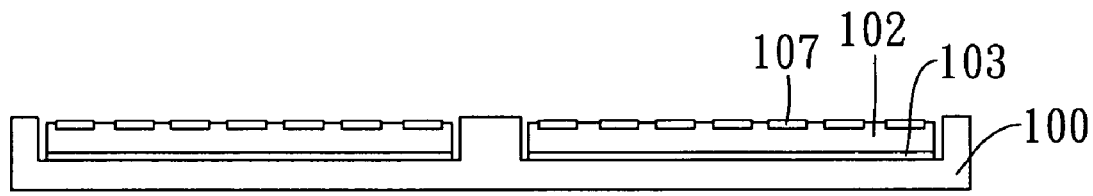
Figure 1D:
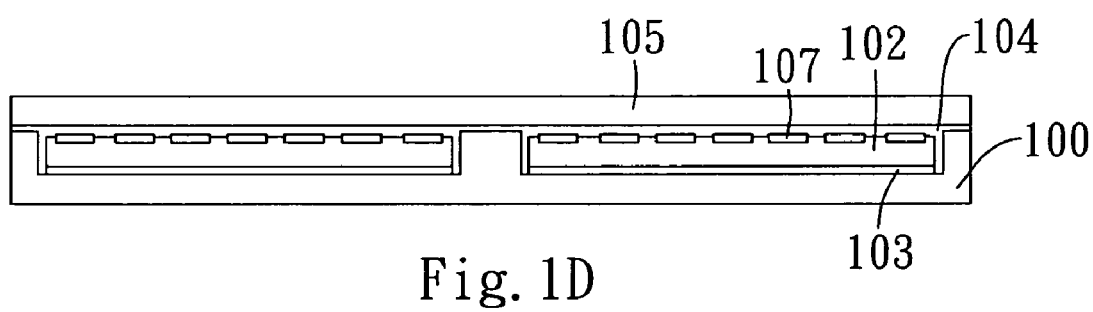
Figure 1E:
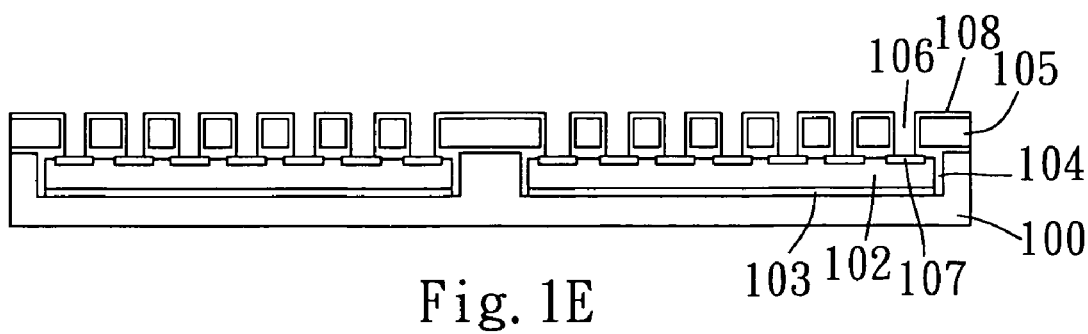
Figure 1F:
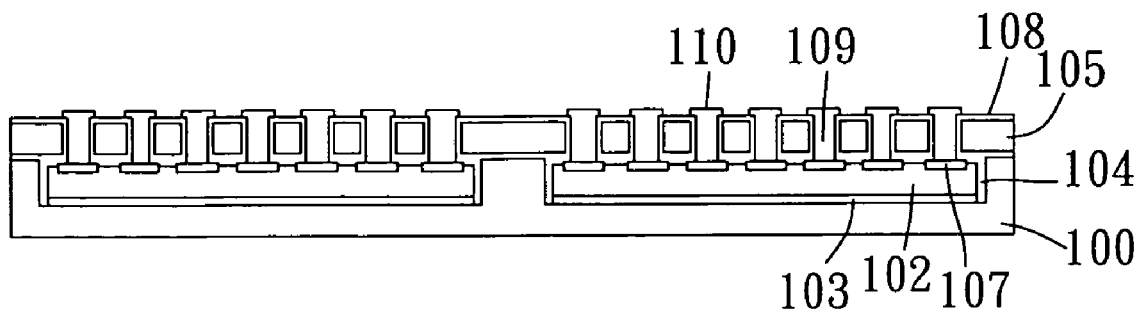
Figure 1G:
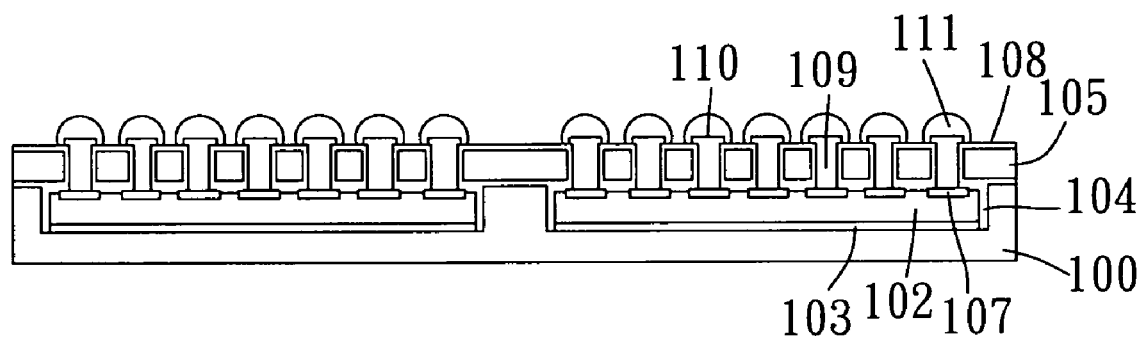
Figure 1H:
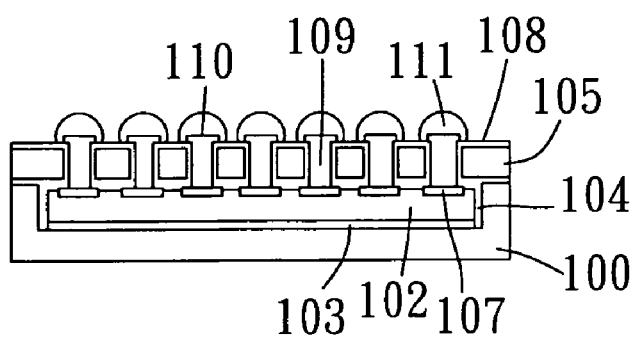
FIG. 1H shows a schematic cross-sectional view of a die-level package structure of a magnetic memory device according to the first embodiment of the present invention.

FIG. 1H shows a schematic cross-sectional view of a die-level package structure of a magnetic memory device according to the first embodiment of the present invention, which is singulated from the wafer-level magnetic shielding package structure shown in FIG. 1G, while FIGS. 1A to 1G are schematic cross-sectional views corresponding to various stages of the method for forming the wafer-level package structure of the magnetic memory device according to the first embodiment of the present invention. The method for fabricating the wafer-level magnetic shielding package structure of the magnetic memory device is illustrated as follows. Referring to FIG. 1A, a magnetic shielding substrate 100, such as a magnetic shielding wafer made of moly-permalloy, supermalloy, alloy 42, metglas 2705M, mushield or a composite containing one of the preceding material, is provided. Subsequently, as shown in FIG. 1B, the magnetic shielding substrate 100 is dry-etched or wet-etched in such a way that at least one cavity 101 is formed therein. Referring to FIG. 1C, at least a magnetic memory device 102, such as a magnetic random access memory (MRAM), is disposed in one of the cavities 101. For example, the magnetic memory device 102 is attached into the cavity 101 by applying a first adhesive layer 103, where the first adhesive layer 103 is a polymer layer or a metal layer. Then a second adhesive layer 104, such as an insulating adhesive of polymer, is applied so that a magnetic shielding layer 105 is laminated thereby or deposited onto the magnetic shielding substrate 100, as shown in FIG. 1D, wherein the cavity 101 of the magnetic shielding substrate 100 is also filled with the second adhesive layer 104. The magnetic shielding layer 105 is a magnetic shielding foil or a magnetic shielding adhesive, which is made of moly-permalloy, supermalloy, alloy 42, metglas 2705M, mushield, or a composite containing one of the preceding material. Referring to FIG. 1E, a plurality of through vias 106 are formed in the magnetic shielding layer 105 by means of dry-etching, laser drilling or wet-etching in such a way that the metal pad 107 for each magnetic memory device 102 is exposed. Afterward, the insulating layer 108, which may be made of the same insulating adhesive of polymer as that of the mentioned second adhesive layer 104, is applied on the fabricated structure, and portions of the insulating layer 108 that are corresponding to the through vias 106 are removed so as to expose the metal pad 107. As shown in FIG. 1F, the plurality of conductive contacts 109 are formed by the metal deposited into the through vias 106 by sputtering or electroless plating, wherein each conductive contact 109 is formed on the metal pad 107 corresponding to one of the through vias 106 and a plurality of conductive pads 110 are correspondingly formed on the top thereof. The conductive contacts 109 as well as the conductive pads 110 also can be made of magnetic shielding and electrically conductive material. Subsequently, as shown in FIG. 1G, the plurality of conductive bumps 111 are respectively formed on one of the conductive pads 110, whereby the electrical connection of the magnetic memory devices 102 to the external is achieved. In this embodiment, the conductive bumps 111 may be solder bumps that are formed by ball-planting, printing or electroplating. Consequently, the wafer-level magnetic shielding package structure according to the present invention is fabricated, and the individual die-level magnetic memory module having a cross-sectional view of FIG. 1H would be obtained by singulating the magnetic shielding substrate 100.

Figure 2A:
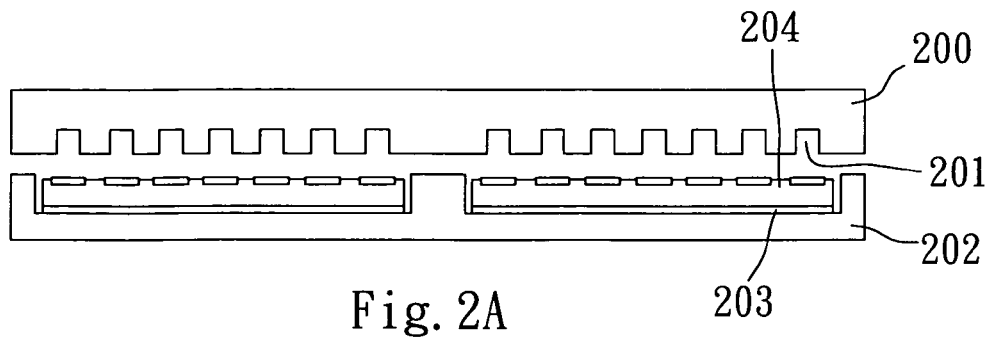
FIGS. 2A to 2D are schematic cross-sectional views corresponding to various stages of a further method for forming the wafer-level package structure of the magnetic memory device of the first embodiment of the present invention.
Figure 2B:
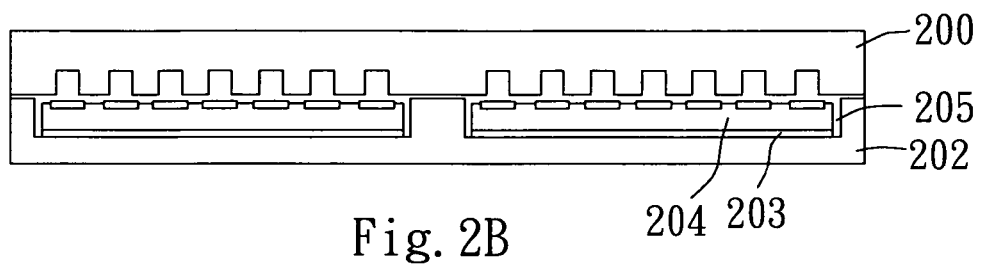
Figure 2C:
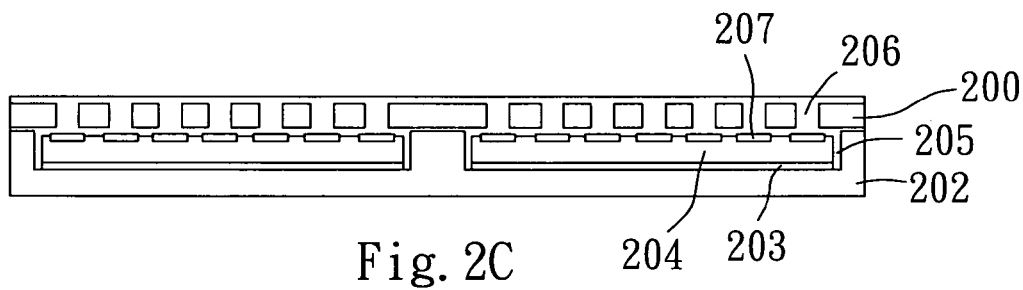
Figure 2D:
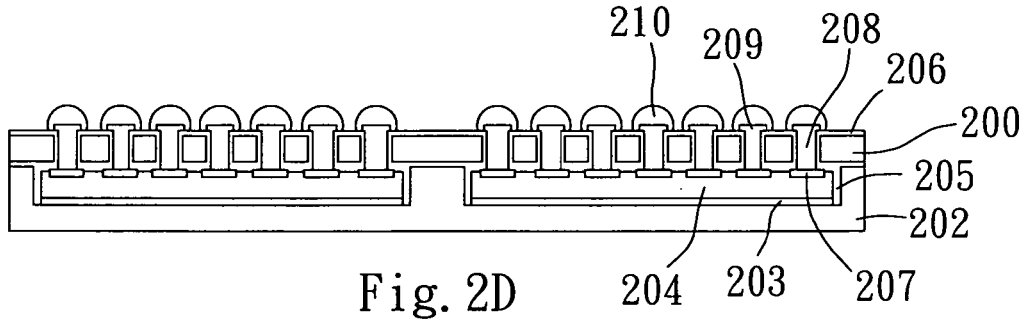
Figure 2E:
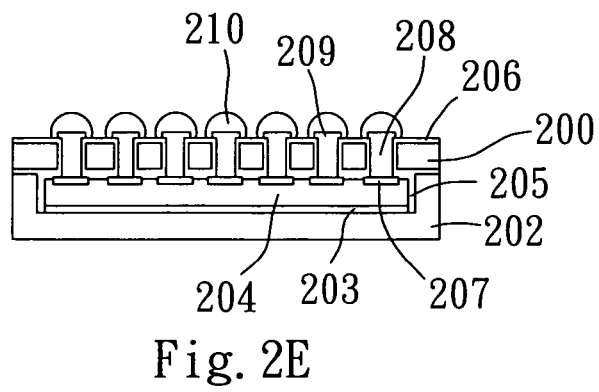
FIG. 2E shows a schematic cross-sectional view of a die-level package structure of the magnetic memory device fabricated by the stages shown in FIGS. 2A to 2D.

With reference to FIG. 2E, a die-level magnetic memory module having the same magnetic shielding package structure as that of the die-level magnetic memory module shown in FIG. 1H but fabricated by a further method is illustrated. FIGS. 2A to 2D are schematic cross-sectional views corresponding to various stages of such further method of the present invention. Referring to FIG. 2A, a first magnetic shielding substrate 200 is provided. The first magnetic shielding substrate 200 can be a magnetic shielding wafer, and below the magnetic shielding substrate 200 a plurality of through vias 201 is formed by means of dry-etching, laser drilling or wet-etching. Moreover, a second magnetic shielding substrate 202, which can also be a magnetic shielding wafer, is provided and therein at least a cavity is formed by means of dry-etching or wet-etching. The first magnetic shielding substrate 200 and the second magnetic shielding substrate 202 are made of moly-permalloy, supermalloy, alloy 42, metglas 2705M, mushield or a composite containing one of the preceding material. Afterward, at least a magnetic memory device 204 is disposed into one of the cavities of the second magnetic shielding substrate 202. For example, the magnetic memory device 204 such as an MRAM is joined into one of the cavities of the second magnetic shielding substrate 202 through a first adhesive layer 203, which is made of polymer material or metal. As shown in FIG. 2B, a second adhesive layer 205, such as an insulating layer of polymer, is applied below the first magnetic shielding substrate 200 and above the second magnetic shielding substrate 202, such that the first magnetic shielding substrate 200 and the second magnetic shielding substrate 202 are laminated and joined to each other. In this case, each of the cavities of the second magnetic shielding substrate 202 is also filled with the second adhesive layer 205. Subsequently, the first magnetic shielding substrate 200 is ground to a level corresponding to the through vias 201 by means of wafer back grinding, and following thereby an insulating layer 206 which may be made of the same insulating adhesive of polymer as that of the mentioned second adhesive layer 205 is applied, as shown in FIG. 2C. Referring to FIG. 2D, a portion of the insulating layer 206 that is corresponding to the through vias 201 of the first magnetic shielding substrate 200 is removed by means of dry-etching or laser drilling so that the metal pads 207 of the magnetic memory devices 204 are exposed, and a plurality of through vias is formed. A plurality of conductive contacts 208 are formed from the metal deposited into the through vias by sputtering, electroless plating or electroplating, wherein each conductive contact 208 is formed on the metal pad 207 corresponding to one of the through vias and a plurality of conductive pads 209 are correspondingly formed on the top thereof. In this case, the conductive contacts 208 as well as the conductive pads 209 can be made of magnetic shielding and electrically conductive material. Subsequently, the plurality of conductive bumps 210 are respectively formed on one of the conductive pads 209, whereby the electrical connection of the magnetic memory devices 204 to the external is achieved. In this embodiment, the conductive bumps 210 can be solder bumps that are formed by ball-planting, printing or electroplating. Consequently, the wafer-level magnetic shielding package structure according to the present invention is fabricated, and the individual die-level magnetic memory module having a cross-sectional view of FIG. 2E would be obtained by singulating the first and second magnetic shielding substrates 200 and 202.

Figure 3:
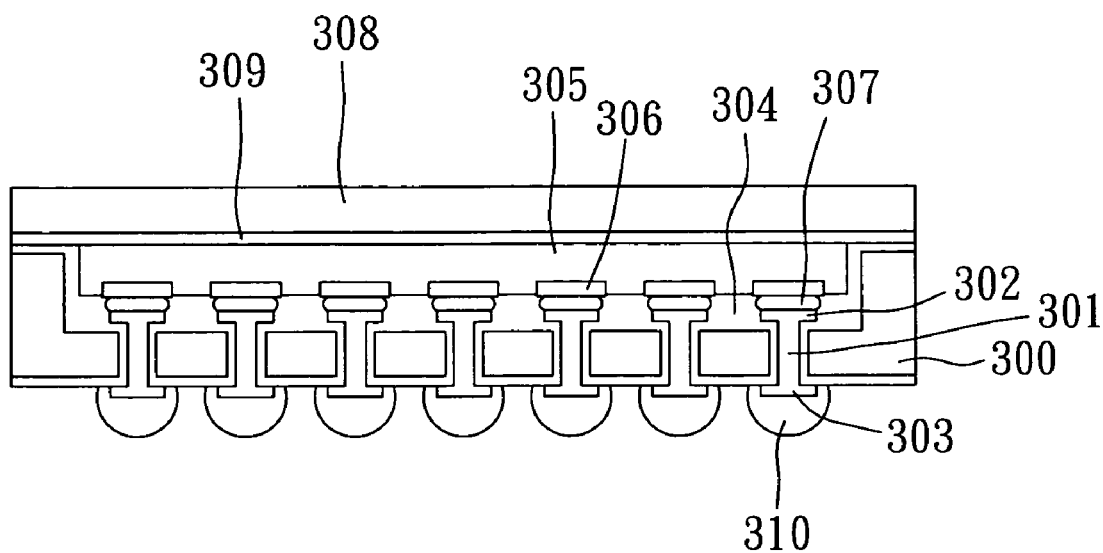
FIG. 3 shows a schematic cross-sectional view of a die-level package structure of a magnetic memory device according to a second embodiment of the present invention.

With reference to FIG. 3, a schematic cross-sectional view of a die-level package structure of a magnetic memory device according to a second embodiment of the present invention is illustrated. According to the second embodiment of the present invention, the magnetic shielding package structure of the magnetic memory device is constructed by a magnetic shielding substrate 300, a plurality of conductive contacts 301, an insulating layer of polymer 304, at least one magnetic memory device 305, a plurality of first conductive bumps 307, a magnetic shielding layer 308, an adhesive layer 309 and a plurality of second conductive bumps 310. The magnetic shielding substrate 300, such as a magnetic shielding wafer made of moly-permalloy, supermalloy, alloy 42, metglas 2705M, mushield or a composite containing one of the preceding material, has at least a cavity and a plurality of through vias formed therein. The respective conductive contact 301 passes through one of the through vias corresponding thereto, and on the top and bottom of each conductive contact 301 a first conductive pad 302 and a second conductive pad 303 are respectively formed. The conductive contacts 301 and the first conductive pads 302 as well as the second conductive pads 303 as mentioned can be made of magnetic shielding and electrically conductive material. The insulating layer of polymer 304 is formed at the surrounding of the through vias so as to provide the electrical insulation between each of the conductive contacts 301 and the magnetic shielding substrate 300. Moreover, the insulating layer of polymer 304 is formed on the upper surface of the magnetic shielding substrate 300, and each cavity of the magnetic shielding substrate 300 is filled therewith. The magnetic memory device 305, an MRAM for example, is joined to the upper side of the magnetic shielding substrate 300 in such a way that a front side of the magnetic memory device 305 is facing down, wherein the conductive pads 306 of the magnetic memory device 305 are joined to the first conductive bumps 302 of the conductive contacts 301 through the first conductive bumps 307. The magnetic shielding layer 308 is laminated onto the backside of the die of magnetic memory devices 305 through the adhesive layer 309, wherein the magnetic shielding layer 308 is made of moly-permalloy, supermalloy, alloy 42, metglas 2705M, mushield or a composite containing one of the preceding material, and the adhesive layer 309 can be an insulating layer of polymer. The second conductive bumps 310 are respectively formed below the second conductive pads 303 of the conductive contacts 301, and thereby the magnetic memory module to be fabricated is able to be directly configured on a printed circuit board. In this embodiment, the second conductive bumps 310 are solder bumps formed by ball-planting, printing or electroplating.

Figure 4:
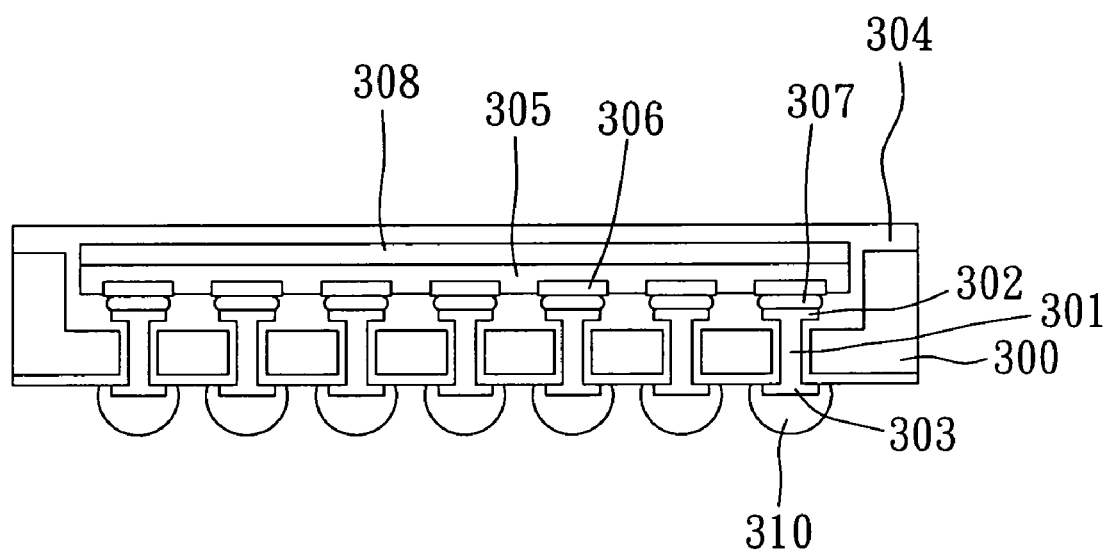
FIG. 4 shows a schematic cross-sectional view of a die-level package structure of a magnetic memory device according to a third embodiment of the present invention.

With reference to FIG. 4, a schematic cross-sectional view of a die-level package structure of a magnetic memory device according to a third embodiment of the present invention is shown. The third embodiment differs from the second one in that the magnetic shielding layer 308 is directly laminated onto the backside of the die of magnetic memory device 305, and the magnetic memory device 305 and the magnetic shielding layer 308 are embedded into the insulating layer of polymer 304.

Figure 5:
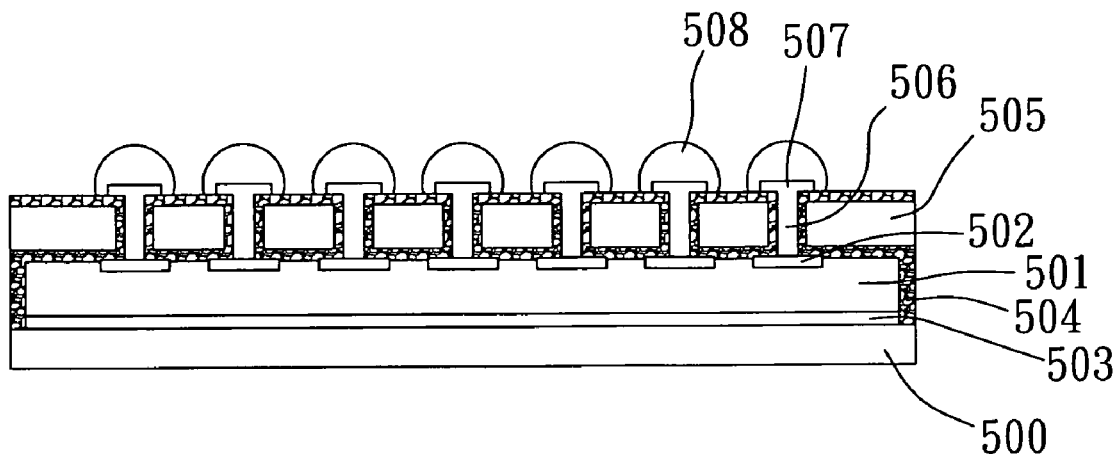
FIG. 5 shows a schematic cross-sectional view of a die-level package structure of a magnetic memory device according to a fourth embodiment of the present invention.

FIG. 5 shows a schematic cross-sectional view of a die-level package structure of a magnetic memory device according to a fourth embodiment of the present invention. As shown in FIG. 5, the magnetic memory device according to the fourth embodiment includes a magnetic shielding substrate 500, at least a magnetic memory device 501, an adhesive layer 503, an insulating layer with plural magnetic shielding particles mixed therein 504, a magnetic shielding layer 505, a plurality of conductive contacts 506 and a plurality of conductive bumps 508. The magnetic memory device 501, such as an MRAM, is disposed on the magnetic shielding substrate 500. In this case, the magnetic memory device 501 and the magnetic shielding substrate 500 are joined to each other with the adhesive layer 503. The adhesive layer 503 can be a polymer layer or a metal layer, while the magnetic shielding layer 505 can be a further magnetic shielding substrate, such as a further magnetic shielding wafer, which is laminated onto the magnetic memory device 501 with the insulating layer with plural magnetic shielding particles mixed therein 504. In other words, the insulating layer with plural magnetic shielding particles mixed therein 504 is laminated between the magnetic shielding layer 505 and the magnetic shielding substrate 500. The magnetic shielding layer 505 can be a magnetic shielding foil made of moly-permalloy, supermalloy, alloy 42, metglas 2705M, mushield or a composite containing one of the preceding material. Furthermore, there exists a plurality of through vias in the magnetic shielding layer 505, where the insulating layer with plural magnetic shielding particles mixed therein 504 is also formed on the surrounding of each of the through vias and the upper surface of the magnetic shielding layer 505. The respective conductive contact 506 passes through one of the through vias and each thereof is formed on one metal pad 502 for the magnetic memory device 501. On the top of each conductive contact 506, a respective conductive pad 507 is formed, where the conductive contacts 506 as well as the conductive pads 507 can be formed by the magnetic shielding and electrically conductive material. The conductive bumps 508 are respectively formed on one of the conductive pads 507 of the respective conductive contacts 506 corresponding thereto, and thereby the magnetic memory module to be fabricated is directly configured onto a printed circuit board. In this case, the conductive bumps 508 can be solder bumps that are formed by means of ball-planting, printing or electroplating.

Figure 6:
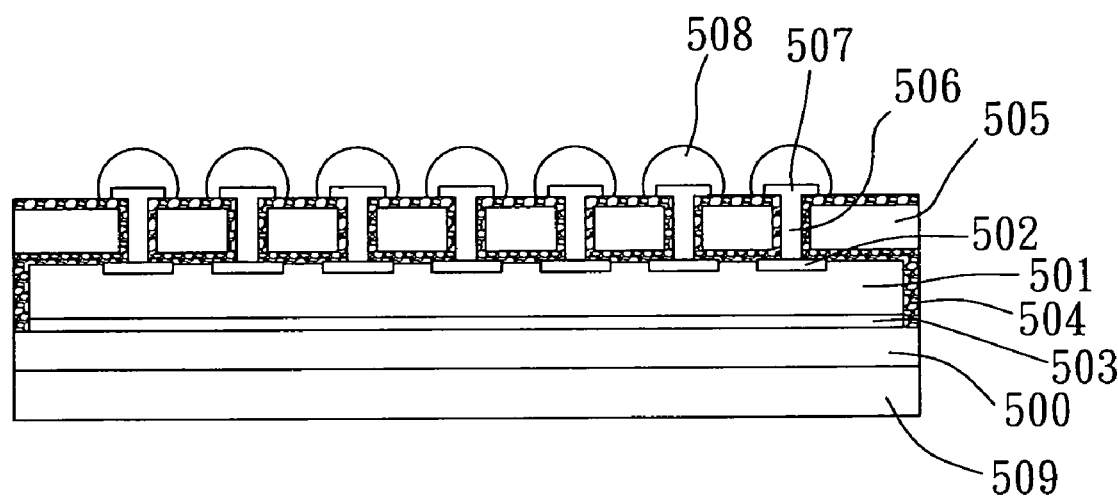
FIG. 6 shows a schematic cross-sectional view of a die-level package structure of a magnetic memory device according to a fifth embodiment of the present invention.

With reference to FIG. 6, a cross-sectional view of a die-level package structure of a magnetic memory device according to a fifth embodiment of the present invention is schematically shown. As shown in FIG. 6, such embodiment is merely different from the fourth one in that a thermal dissipating layer 509 such as a metallic thermal dissipating layer is further applied and laminated onto the backside of the magnetic shielding substrate 500 so as to improve the thermal dissipation for the magnetic memory module.

Figure 7:
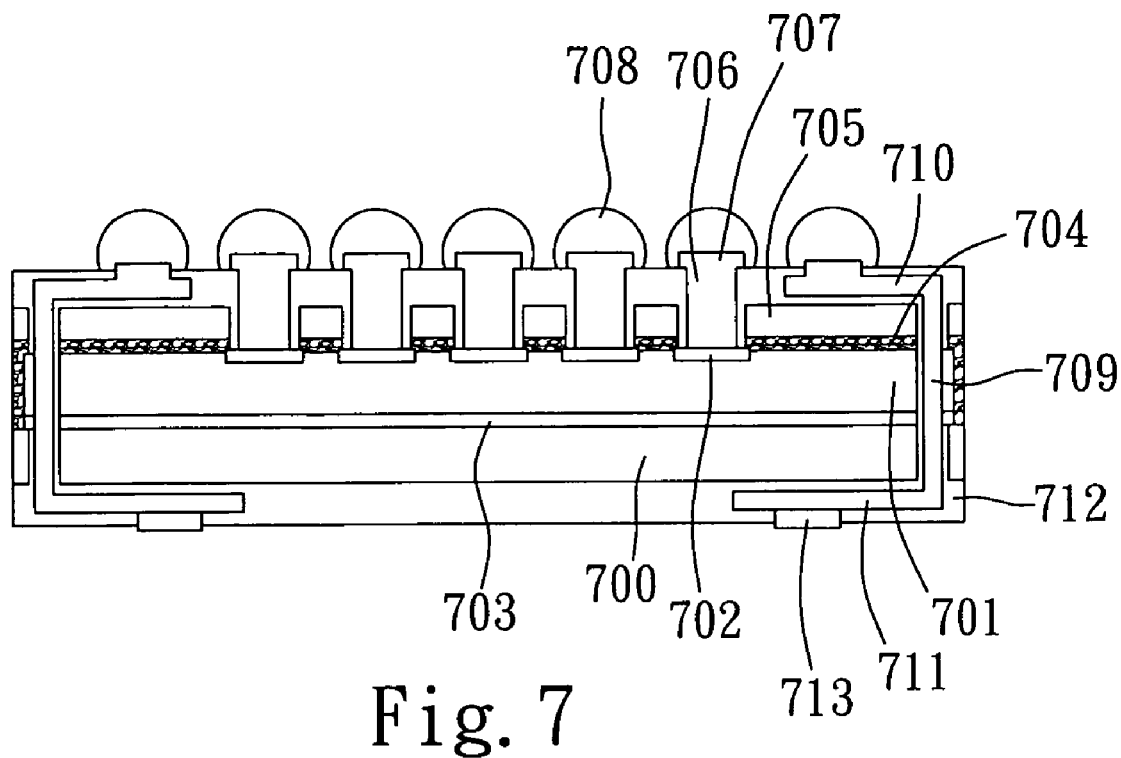
FIG. 7 shows a schematic cross-sectional view of a die-level package structure of a magnetic memory device according to a sixth embodiment of the present invention.

FIG. 7 shows a schematic cross-sectional view of a die-level package structure of a magnetic memory device according to a sixth embodiment of the present invention. The magnetic shielding package structure of the magnetic memory device according to this embodiment is constructed by a magnetic shielding substrate 700, at least a magnetic memory device 701, an adhesive layer 703, an insulating layer with magnetic shielding particles mixed therein 704, a magnetic shielding layer 705, a plurality of conductive contacts 706, a plurality of conductive bumps 708, a plurality of vertical wires 709, a first wiring redistribution layer 710, a second wiring redistribution layer 711 and an insulating layer of polymer 712. The magnetic memory device 701, such as an MRAM, is disposed on the magnetic shielding substrate 700. In this case, the magnetic memory device 701 and the magnetic shielding substrate 700 are joined to each other with the adhesive layer 703. The magnetic shielding substrate 700 can be a magnetic shielding wafer, and the adhesive layer 703 can be made of polymer material or metal. The magnetic shielding layer 705 is laminated onto the magnetic memory device 701 with the insulating layer with magnetic shielding particles mixed therein 704. In this case, the magnetic shielding layer 705 can be a magnetic shielding foil made of molypermalloy, supermalloy, alloy 42, metglas 2705M, mushield or a composite containing one of the preceding material. Furthermore, there exists a plurality of first through vias in the magnetic shielding layer 705, and the respective conductive contact 706 passes through one of the first through vias corresponding thereto and each thereof is formed on one metal pad 702 for the magnetic memory device 701. On the top of each conductive contact 706, a respective conductive pad 707 is formed, where the conductive contacts 706 as well as the conductive pads 707 can be formed by the magnetic shielding and electrically conductive material. The conductive bumps 708 are respectively formed on one of the conductive pads 707 of the conductive contacts 706 corresponding thereto, and can be solder bumps that are formed by means of ball-planting, printing or electroplating. The insulating layer of polymer 712 is formed not only above the magnetic shielding layer 705 but also below the magnetic shielding substrate 700, where the first through vias of the magnetic shielding layer 705 are filled with the insulating layer of polymer 712 at the surrounding thereof. There exists a plurality of second through vias formed and passing through the magnetic shielding layer 705, the insulating layer with magnetic shielding particles mixed therein 704, the magnetic memory device 701, the adhesive layer 703 and the magnetic shielding substrate 700, where the insulating layer of polymer 712 is formed within the second through vias at the surrounding thereof. The respective vertical wires 709 pass through one of the second through vias corresponding thereto, whereby the first wiring redistribution layer 710 and the second wiring redistribution layer 711, located above the magnetic shielding layer 705 and below the magnetic shielding substrate respectively, are electrically connected with each other, and hence the electrical connection of the magnetic memory module is guided from a front side thereof to a backside thereof. Accordingly, the package structure of the magnetic memory module of the present invention is applicable in a three-dimensional stacking architecture, so as to increase the capacity of the memory. Furthermore, the first wiring redistribution layer 710 and the second wiring redistribution layer 711 are respectively electrically connected to at least one conductive pad 707 and 713.

Figure 8:
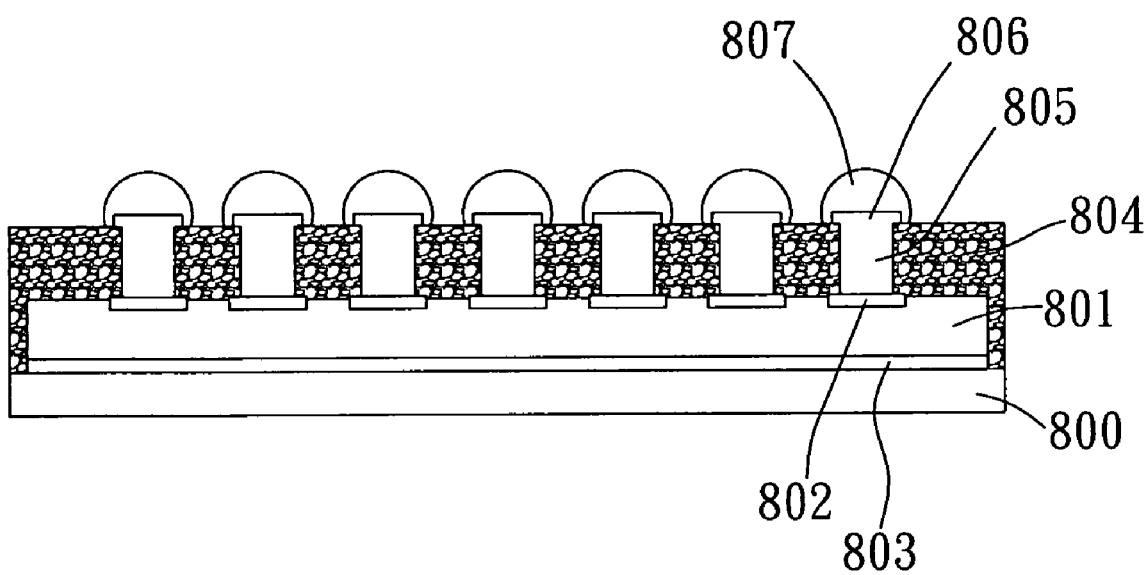
FIG. 8 shows a schematic cross-sectional view of a die-level package structure of a magnetic memory device according to a seventh embodiment of the present invention.

With reference to FIG. 8, a cross-sectional view of a die-level package structure of a magnetic memory device according to a seventh embodiment of the present invention is schematically illustrated. Regarding the present embodiment, the magnetic shielding package structure of the magnetic memory device according thereto includes a magnetic shielding substrate 800, at least a magnetic memory device 801, an adhesive layer 803, an insulating layer with magnetic shielding particles mixed therein 804, a plurality of conductive contacts 805 and a plurality of conductive bumps 807. The magnetic memory device 801, such as an MRAM, is disposed on the magnetic shielding substrate 800. The magnetic shielding substrate 800 can be a magnetic shielding wafer, and the adhesive layer 803 can be made of polymer material or metal. The insulating layer with magnetic shielding particles mixed therein 804 is formed on the magnetic memory device 801, and there is a plurality of through vias formed and passing therethrough. The respective conductive contact 805 passes through one of the through vias corresponding thereto, and each of which is formed on one metal pad 802 for the magnetic memory device 801. On the top of each conductive contact 805, a conductive pad 806 corresponding thereto is formed, and both the conductive contacts 805 and conductive pads 806 can be made of magnetic shielding and electrically conductive material. The conductive bumps 807, which can be solder bumps that are formed by means of ball-planting, printing or electroplating, are respectively formed on one of the conductive pads 806 corresponding thereto, and thereby the magnetic memory module is directly configured on a printed circuit board.

Figure 9:
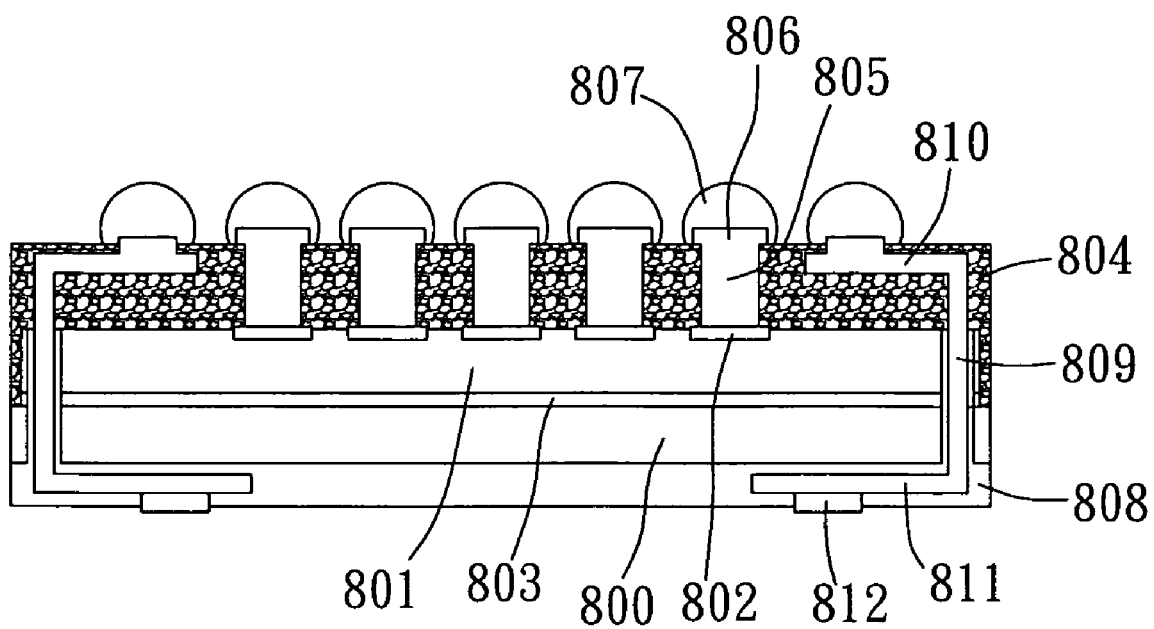
FIG. 9 shows a schematic cross-sectional view of a die-level package structure of a magnetic memory device according to an eighth embodiment of the present invention.

FIG. 9 shows a schematic cross-sectional view of a die-level package structure of a magnetic memory device according to an eighth embodiment of the present invention. As show in FIG. 9, the magnetic shielding package structure of the magnetic memory device is constructed by a magnetic shielding substrate 800, at least a magnetic memory device 801, an adhesive layer 803, an insulating layer with magnetic shielding particles mixed therein 804, a plurality of conductive contacts 805, a plurality of conductive bumps 807, an insulating layer of polymer 808, plural vertical wires 809, a first wiring redistribution layer 810 and a second wiring redistribution layer 811. The magnetic memory device 801, such as an MRAM, is disposed on the magnetic shielding substrate 800. In this case, the magnetic memory device 801 and the magnetic shielding substrate 800 are joined to each other with the adhesive layer 803. The magnetic shielding substrate 800 can be a magnetic shielding wafer, and the adhesive layer 803 can be made of polymer material or metal. The insulating layer with magnetic shielding particles mixed therein 804 is formed above and on the lateral sides of the magnetic memory device 801. The insulating layer with magnetic shielding particles mixed therein 804 has a plurality of first through vias, and the conductive contacts 805 respectively passing through one of the first through vias corresponding thereto are formed on a metal pad 802 of the magnetic memory device 801. On the top of each conductive contact 805, a metal pad 806 is provided, and the conductive contacts 805 and the metal pads 806 both can be formed by magnetic shielding and electrically conductive material. The conductive bumps 807, which can be solder bumps formed by ball-planting, printing or electroplating, are respectively provided on one of the metal pads 806 corresponding thereto. There is a plurality of second through vias passing through the insulating layer with magnetic shielding particles mixed therein 804, the magnetic memory device 801, the adhesive layer 803 and the magnetic shielding substrate 800, while the insulating layer of polymer 808 is provided in the second through vias at the surrounding thereof and below the magnetic shielding substrate 800. In this case, the first wiring redistribution layer 810 located within the insulating layer with magnetic shielding particles mixed therein 804 and the second wiring redistribution layer 811 located below the magnetic shielding substrate 800 are electrically connected with each other with the vertical wires 809 respectively passing through one of the second through vias corresponding thereto, so that the electrical connection of the magnetic memory module is guided from the front side thereof to the backside thereof. Accordingly, the package structure of the magnetic memory module as disclosed is applicable in a three-dimensional stacking architecture, so as to increase the capacity of memory. Furthermore, the first wiring redistribution layer 810 and the second wiring redistribution layer 811 are respectively electrically connected to at least one conductive pad 806 and 812.

According to the present invention, the magnetic memory device is laminated and embedded between the magnetic shielding substrate and the magnetic shielding material, and the wafer-level packaging scheme is adopted. In this case, the package structure of the present invention not only protects the magnetic memory device from being interfered by an external magnetic field so as to avoid the error operation and improve the performance thereof, but the dimension and the fabrication cost thereof are also reduced.

While the invention has been described by way of examples and in terms of preferred embodiments, it is to be understood that various changes, substitutions, and alterations can be made herein without departing from the spirit and scope of the invention as defined by the appended claims.

What is claimed is:

1. A magnetic shielding package structure of a magnetic memory device, comprising:
   a magnetic shielding substrate;
   at least a magnetic memory device on said magnetic shielding substrate;
   a magnetic shielding layer laminated onto said magnetic memory device with an adhesive layer and having a plurality of first through vias; and
   a plurality of conductive contacts passing through one of said first through vias corresponding thereto respectively, whereby an electrical connection between said magnetic memory device and the external is established.

2. The magnetic shielding package structure of a magnetic memory device of claim 1, wherein said magnetic shielding substrate is formed of a magnetic shielding material including moly-permallay, supermalloy, alloy 42, metglas 2705M, mushield, or a composite containing one of the preceding material.

3. The magnetic shielding package structure of a magnetic memory device of claim 1, wherein said magnetic shielding substrate has at least one cavity for receiving said magnetic memory device therein.

4. The magnetic shielding package structure of a magnetic memory device of claim 1, wherein said magnetic shielding layer is a magnetic shielding material including moly-permallay, supermalloy, alloy 42, metglas 2705M, mushield, or a composite containing one of the preceding material.

5. The magnetic shielding package structure of a magnetic memory device of claim 1, wherein said magnetic memory device is joined to said magnetic shielding substrate with a further adhesive layer.

6. The magnetic shielding package structure of a magnetic memory device of claim 5, wherein said further adhesive layer comprises one of a polymer material and a metal.

7. The magnetic shielding package structure of a magnetic memory device of claim 1, wherein said adhesive layer comprises one of an insulating layer of polymer and an insulating layer with magnetic shielding particles mixed therein.

8. The magnetic shielding package structure of a magnetic memory device of claim 1, wherein said conductive contacts are formed by a magnetic shielding material.

9. The magnetic shielding package structure of a magnetic memory device of claim 1, further comprising an insulating layer on said magnetic shielding layer and a plurality of conductive pads formed on said insulating layer, wherein said conductive pads are electrically connected to one of said conductive contacts corresponding thereto respectively.

10. The magnetic shielding package structure of a magnetic memory device of claim 9, further comprising a wiring redistribution layer formed in said insulating layer.

11. The magnetic shielding package structure of a magnetic memory device of claim 9, further comprising a plurality of conductive bumps formed on one of said conductive pads corresponding thereto respectively.

12. The magnetic shielding package structure of a magnetic memory device of claim 9, wherein said conductive pads are formed by a magnetic shielding material.

13. The magnetic shielding package structure of a magnetic memory device of claim 10, wherein said wiring redistribution layer is formed by a magnetic shielding material.

14. The magnetic shielding package structure of a magnetic memory device of claim 1, further comprising a thermal dissipating layer disposed on a backside of said magnetic shielding layer.

15. The magnetic shielding package structure of a magnetic memory device of claim 10, further comprising a plurality of second through vias passing therethrough, and comprising a plurality of vertical wires passing through one of said second through vias corresponding thereto respectively and electrically connected with said wiring redistribution layer, whereby an electrical connection of said magnetic shielding package structure is guided from a front side thereof to a backside thereof.

16. The magnetic shielding package structure of a magnetic memory device of claim 1, wherein said magnetic shielding substrate is a magnetic shielding wafer.

17. A magnetic shielding package structure of a magnetic memory device, comprising:
   a magnetic shielding substrate;
   at least a magnetic memory device on said magnetic shielding substrate;
   a magnetic shielding layer laminated onto said magnetic memory device and having a plurality of first through vias; and
   a plurality of conductive contacts passing through one of said first through vias corresponding thereto respectively, whereby an electrical connection between said magnetic memory device and the external is established.

18. The magnetic shielding package structure of a magnetic memory device of claim 17, wherein said magnetic shielding layer comprises an insulating layer with magnetic shielding particles mixed therein.

19. The magnetic shielding package structure of a magnetic memory device of claim 17, wherein said magnetic shielding substrate is formed of a magnetic shielding material including moly-permallay, supermalloy, alloy 42, metglas 2705M, mushield, or a composite containing one of the preceding material.

20. The magnetic shielding package structure of a magnetic memory device of claim 17, wherein said magnetic memory device is joined to said magnetic shielding substrate with an adhesive layer.

21. The magnetic shielding package structure of a magnetic memory device of claim 17, wherein said conductive contacts are formed by a magnetic shielding material.

22. The magnetic shielding package structure of a magnetic memory device of claim 17, further comprising a plurality of conductive pads formed on said magnetic shielding layer and electrically connected to one of said conductive contacts corresponding thereto respectively.

23. The magnetic shielding package structure of a magnetic memory device of claim 17, further comprising a wiring redistribution layer formed in said magnetic shielding layer, a plurality of second through vias passing therethrough, and a plurality of vertical wires passing through one of said second through vias corresponding thereto respectively and electrically connected with said wiring redistribution layer, whereby an electrical connection of said magnetic shielding package structure is guided from a front side thereof to a backside thereof.

24. The magnetic shielding package structure of a magnetic memory device of claim 20, wherein said adhesive layer comprises one of a polymer material and a metal.

25. The magnetic shielding package structure of a magnetic memory device of claim 17, wherein said magnetic shielding substrate is a magnetic shielding wafer.

26. A magnetic shielding package structure of a magnetic memory device, comprising:
   a magnetic shielding substrate having a plurality of through vias;
   at least a magnetic memory device configured on said magnetic shielding substrate with a first adhesive layer in such a way that a front side thereof is facing down;
   a magnetic shielding layer laminated onto a backside of said magnetic memory device with a second adhesive layer; and
   a plurality of conductive contacts passing through one of said first through vias corresponding thereto respectively, whereby an electrical connection between said magnetic memory device and the external is established.

27. The magnetic shielding package structure of a magnetic memory device of claim 26, wherein said magnetic shielding substrate has at least one cavity for configuring said magnetic memory device therein.

28. The magnetic shielding package structure of a magnetic memory device of claim 26, where said first adhesive layer is a conductive bump.

29. The magnetic shielding package structure of a magnetic memory device of claim 26, wherein said conductive contacts are formed by a magnetic shielding material.

30. The magnetic shielding package structure of a magnetic memory device of claim 26, wherein said magnetic shielding substrate is a magnetic shielding material including moly-permallay, supermalloy, alloy 42, metglas 2705M, mushield, or a composite containing one of the preceding material.

31. The magnetic shielding package structure of a magnetic memory device of claim 26, wherein said magnetic shielding layer is a magnetic shielding material including moly-permallay, supermalloy, alloy 42, metglas 2705M, mushield, or a composite containing one of the preceding material.

32. The magnetic shielding package structure of a magnetic memory device of claim 26, wherein said second adhesive layer comprises one of an insulating layer of polymer and an insulating layer with magnetic shielding particles mixed therein.

33. The magnetic shielding package structure of a magnetic memory device of claim 27, wherein said cavity of said magnetic shielding substrate is filled with an insulating polymer material or an insulating material with magnetic shielding particles mixed therein.

* * * * *